(12) United States Patent
Tonti et al.

(10) Patent No.: US 6,436,749 B1
(45) Date of Patent: Aug. 20, 2002

(54) METHOD FOR FORMING MIXED HIGH VOLTAGE (HV/LV) TRANSISTORS FOR CMOS DEVICES USING CONTROLLED GATE DEPLETION

(75) Inventors: William R. Tonti, Essex Junction; Claude L. Bertin, South Burlington; Jeffrey P. Gambino, Westford; Russell J. Houghton, Essex Junction, all of VT (US); Jack A. Mandelman, Stormville, NY (US); Wilbur D. Pricer, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 09/658,655

(22) Filed: Sep. 8, 2000

(51) Int. Cl.[7] .......................................... H01L 21/8238
(52) U.S. Cl. ........................ 438/199; 438/261; 438/263
(58) Field of Search ................................. 438/301–306, 438/261–263, 585; 257/407–413

(56) References Cited

U.S. PATENT DOCUMENTS

| | | | |
|---|---|---|---|
| 4,661,838 A | 4/1987 | Wildi et al. ................. 357/23.8 |
| 5,296,393 A | 3/1994 | Smayling et al. | |
| 5,393,676 A | * | 2/1995 | Anjum et al. ................ 438/301 |
| 5,602,410 A | 2/1997 | Schwalke et al. ............ 257/401 |
| 5,637,903 A | 6/1997 | Liao et al. ................... 257/412 |
| 5,648,668 A | 7/1997 | Kasai ........................... 257/280 |
| 5,763,912 A | 6/1998 | Parat et al. .................. 257/315 |
| 5,888,870 A | * | 3/1999 | Garden et al. .............. 257/413 |
| 5,962,904 A | 10/1999 | Hu .............................. 257/412 |
| 6,291,868 B1 | * | 9/2001 | Weimer et al. .............. 257/413 |

* cited by examiner

Primary Examiner—David Nelms
Assistant Examiner—Dung A Le
(74) Attorney, Agent, or Firm—Mark Chadurjian; Cantor Colburn LLP (57) ABSTRACT

A method for forming mixed high voltage/low voltage (HV/LV) transistors for CMOS devices is disclosed. In an exemplary embodiment, depletion of the gate conductor is controlled by leaving a fixed region of the gate conductor intrinsic, or lightly doped, thus separating the heavily doped low resistivity portion of the electrode with an intrinsic region by use of a conducting dopant barrier. The barrier is conductive in nature, but acts as a well-controlled diffusion barrier, stopping the "fast" diffusion which normally takes place in polysilicon, and eliminating diffusion between the conductors. Thereby, the device performance may be precisely predicted by carefully controlling the gate conductor thickness.

12 Claims, 11 Drawing Sheets

NG: N CHANNEL ENHANCEMENT MODE DEVICE WITH N DOPED POLY. CAN WITHSTAND HIGH GATE-TO-CHANNEL/DRAIN VOLTAGE

PG: N CHANNEL DEPLETION MODE DEVICE WITH P DOPED POLY. ACTS AS THIN OXIDE TRANSISTOR WHEN THE GATE IS MORE POSITIVE THAN THE CHANNEL. CAN WITHSTAND HIGH CHANNEL/DRAIN-TO-GATE VOLTAGE

NG: P CHANNEL DEPLETION MODE DEVICE WITH N DOPED POLY, ACTS AS THIN OXIDE TRANSISTOR WHEN THE GATE IS MORE NEGATIVE THAN THE CHANNEL. CAN WITHSTAND HIGH GATE-TO-CHANNEL VOLTAGE

PG: P CHANNEL ENHANCEMENT MODE DEVICE WITH P DOPED POLY, CAN WITHSTAND HIGH CHANNEL/DRAIN-TO-GATE VOLTAGE

METHOD FOR FORMING MIXED HIGH VOLTAGE (HV/LV) TRANSISTORS FOR CMOS DEVICES USING CONTROLLED GATE DEPLETION

BACKGROUND OF THE INVENTION

The present invention relates to a method of forming semiconductor transistor devices. In particular, the present invention relates to a method and structure for mixed high voltage/low voltage CMOS devices using controlled gate depletion.

In complementary metal oxide silicon (CMOS) technology, there has been a continuing trend in the semiconductor industry to enhance the speed and density of CMOS integrated circuit devices. Advances in essential fabrication techniques such as photolithography and reactive ion etching (RIE) have contributed to successful device miniaturization and reduction in channel length.

Enhancement of device performance also has been accomplished by efforts to reduce capacitances. However, incorporation of thin silicon oxide gate insulators has led to limitation of voltages that may be high enough to result in gate dielectric wear out or breakdown. Accordingly, in order to facilitate high performance with thin silicon oxide gate dielectrics in specific CMOS device locations where higher voltages are demanded, CMOS device fabrication had to be devised to satisfy both demands. Such customization has been realized by utilizing thicker gate oxide material in the areas demanding higher gate voltages, and using thinner gate oxide layers in the areas where required by performance needs. Disadvantageously, however, processes designed to fabricate gate oxide dielectrics of varying thicknesses either grown or deposited on the same CMOS chip tends to suffer from yield or reliability losses, thus resulting in increases in manufacturing costs. This basically is caused by an intrinsic masking and removal step on one or more of the multiple oxides during the growth or deposition of a second thickness.

SUMMARY OF THE INVENTION

Now, according to the present invention, mixed high voltage/low voltage capability in CMOS devices is accomplished by controlling depletion of the gate conductor. Depletion is controlled by leaving a fixed region of the gate conductor intrinsic, or lightly doped, thus separating the heavily doped low resistivity portion of the electrode with an intrinsic region by use of a conducting dopant barrier. The barrier is conductive in nature, but acts as a well controlled diffusion barrier, stopping the "fast" diffusion which normally takes place in polysilicon, and eliminating diffusion between the conductors. Device performance can be precisely predicted by carefully controlling gate conductor thickness.

BRIEF DESCRIPTION OF THE DRAWINGS

For further understanding of the present invention, reference should be made to the following detailed description of the preferred embodiments thereof, taken in conjunction with the accompanying drawings in which like elements have been designated with like reference numerals, and wherein.

DETAILED DESCRIPTION OF THE INVENTION

Figure 1:
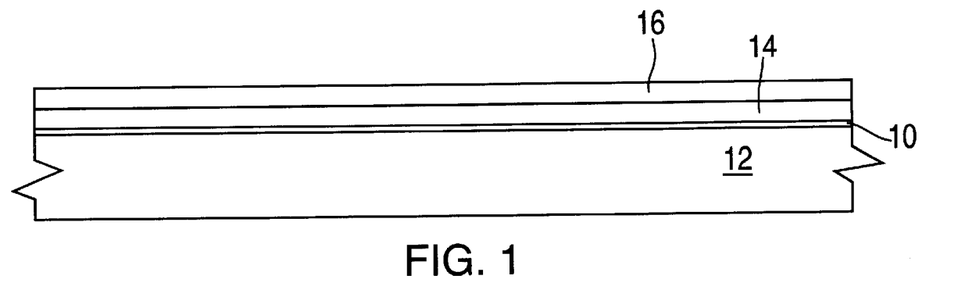
FIG. 1 is a cross-sectional illustration of a portion of substrate on which a dielectric layer, a polysilicon layer, and a tungsten nitride layer have been formed.
Figure 2:
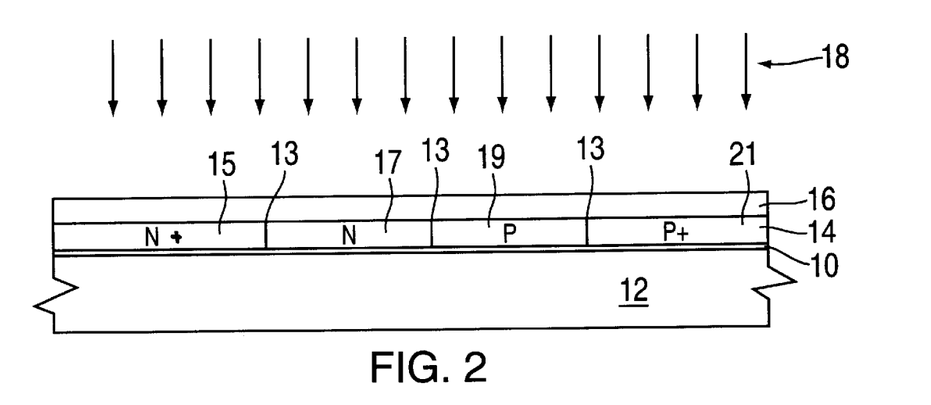
FIG. 2 shows a cross-section of the structure of FIG. 1 to which masked plasma immersion implants have been made.
Figure 3:
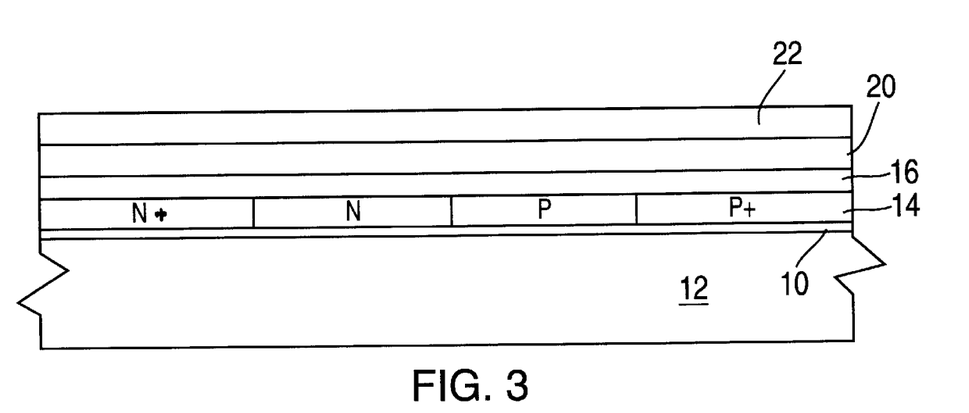
FIG. 3 depicts the structure of FIG. 2 after layers of tungsten silicide and silicon nitride have been deposited.
Figure 4:
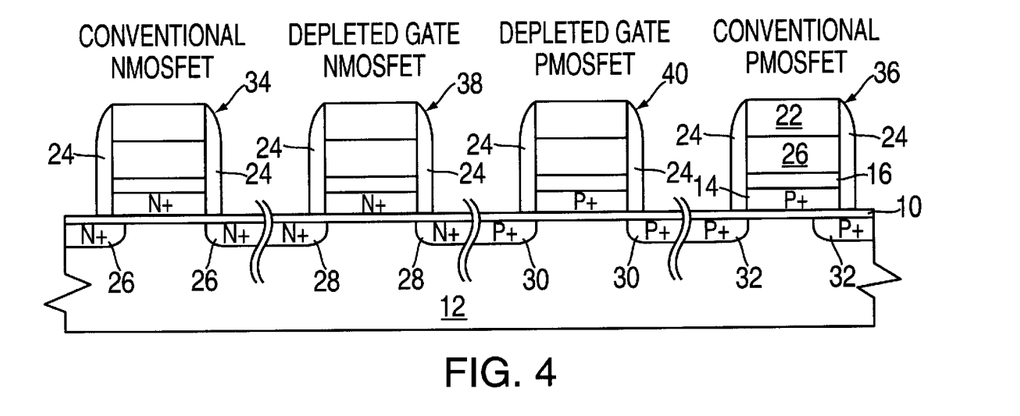
FIG. 4 is a cross-sectional view of completed devices pursuant to the present invention, after conventional processing.

Referring to the drawings, FIGS. 1–4 illustrate one embodiment of a fabrication process, according to the present invention, for forming the dynamic random access memory (DRAM) devices shown in FIG. 4. In FIG. 1, following conventional patterning steps of isolation and well fabrication, a gate dielectric layer 10 is formed on silicon semiconductor substrate 12. Dielectric layer 10 typically may be a thermally-oxidized silicon dioxide or nitrided silicon dioxide material which can be grown in an oxygen-stream or dry oxygen ambient atmosphere at a temperature generally between about 800 to 1100° C., to a thickness between about 20 to 150 Angstroms (A). Then a thin (about 20–30 nm) first gate layer 14 of intrinsic or lightly doped polysilicon or amorphous silicon is deposited. Deposition of polysilicon layer 14 typically can be accomplished using conventional low pressure chemical vapor deposition (LPCVD) techniques at temperatures between about 580 to 640° C. Finally, a conductive diffusion barrier layer 16 then is deposited over the polysilicon layer 14. The diffusion barrier layer 16 is selected from the group consisting of tungsten nitride (WN), tantalum silicon nitride (TaSiN), titanium nitride (TiN), and the like. Tungsten nitride is preferred and can be formed using conventional plasma vapor deposition (PVD) techniques at a temperature of about 100° C.

As illustrated in FIG. 2, the structure of FIG. 1 then is subjected to masked plasma immersion implants (depicted by arrows 18) that are made through the tungsten nitride diffusion barrier layer and into the underlying thin polysilicon gate layer 14. The penetration range of the implants is designed such that the peak falls within the polysilicon layer 14, with a negligible dose entering the underlying silicon substrate 12. The very low effective energies attainable with plasma immersion doping enables selective doping of the thin polysilicon layer 14. In the embodiment shown in FIG. 2, four distinct implants are effected, separated by neutral regions 13, represented only by dotted vertical lines in the drawings. The N+ (15) and P+ (21) implants serve to dope the polysilicon layer 14 to degeneracy to accommodate the subsequent formation of conventional N-type metal oxide silicon field effect transistors (NMOSFETs) and P-type metal oxide silicon field effect transistors (PMOSFETs) respectively. The N (17) and P (19) implanted regions of the polysilicon layer 14 will form a portion of the gate conductor for controlled gate depletion MOSFETs to be subsequently formed. The implantation generally may be accomplished by techniques such as plasma immersion ion implantation (PIII), plasma doping (PLAD), or a combination thereof. Using PIII techniques, suitable implantation for phosphorous or arsenic may be accomplished using an energy between about 100 eV to 20 KeV. Using PLAD techniques, arsenic doping may be accomplished using an energy of about 1 KeV; boron doping may be accomplished using an energy between about 0.7 to 5 KeV. For the N+ (15) and P+ (21) implants, a dosage level is used which provides a concentration greater than or equal to about 5E19 $cm^{-3}$. For the N (17) and P (19) implanted regions, a concentration of about 5E15 to 3E17 $cm^{-3}$ is sought. This range of doping allows full depletion to be obtained in the thin polysilicon layer for the polysilicon thickness used and for the specific operating voltages present in the circuit in which the devices are to be utilized.

FIG. 3 depicts the structure of FIG. 2 after a second, highly conductive gate layer of a self-aligned silicide ($WSi_x$) 20 has been deposited. This saliciding step can be conducted using conventional chemical vapor deposition (CVD) processing at a temperature less than about 650° C., to a thickness of about 500 to 2500 Å. The silicide generally is selected from the group consisting of tungsten silicide ($WSi_x$), cobalt silicide ($CoSi_x$), titanium silicide (TiSix), nickel silicide (NiSix), and the like. A $WSi_x$ layer is preferred. A low temperature process is employed to minimize interdiffusion within the polysilicon layer 14. A protective cap layer 22 has been applied over the $WSi_x$ layer 20. This protective cap layer may be selected from the group consisting of deposited oxide or SiN. A SiN protective cap layer is preferred. The SiN layer is applied using standard CVD processing at a low temperature (typically about 650° C. rapid thermal processing (RTP) for 30 seconds, or 700° C. RTP for 10 seconds). The SiN layer 22 serves as an insulating cap over the gate conductor to be formed, which enables the formation of diffusion contacts which are borderless to the gate conductor.

Figure 4A:
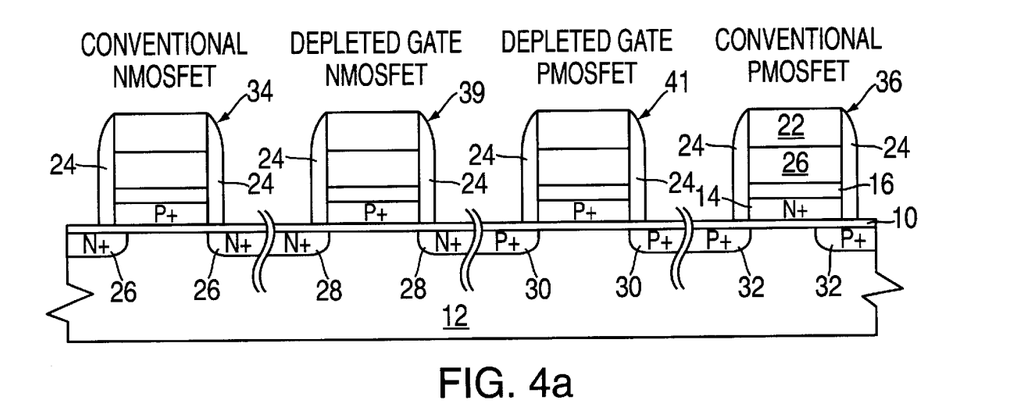
FIG. 4a is a cross-sectional view of additional completed devices pursuant to the present invention, after conventional processing.

FIGS. 4 and 4a show completed MOSFET devices pursuant to the present invention. To accomplish these devices, conventional photoresist procedures are applied to the structure of FIG. 3 to define the desired image of gate structures, and then reactive ion etching (RIE) procedures then are employed, typically using $SF_6$ and HBr to etch the structure. After photoresist removal, a deposition of a conformal oxide, such as tetraethylorthosilicate (TEOS)—based CVD oxide, is applied and an anisotropic reactive ion etch then is performed, typically using $CHF_3$ and $CF_4$, to create TEOS sidewall spacers 24. After spacer 24 formation and careful wet chemical cleans, an ion implantation step is conducted to create source/drain diffusion implants for source/drain regions 26, 28, 30, and 32 for both the conventional MOSFET devices 34 and 36 and depleted gate MOSFET devices 38, 39,40, and 41. Standard lithography and RIE processing can be used to create vias to both the conventional and depleted gates, and via holes also are made to the source and drain regions. Metallization can be applied by rf sputtering, and standard photolithographic and RIE processing can be employed to create metal contacts to the gates.

FIGS. 5–7a illustrate another embodiment of the invention wherein logic technology with salicided source/drains and gate conductors are produced.

Figure 5:
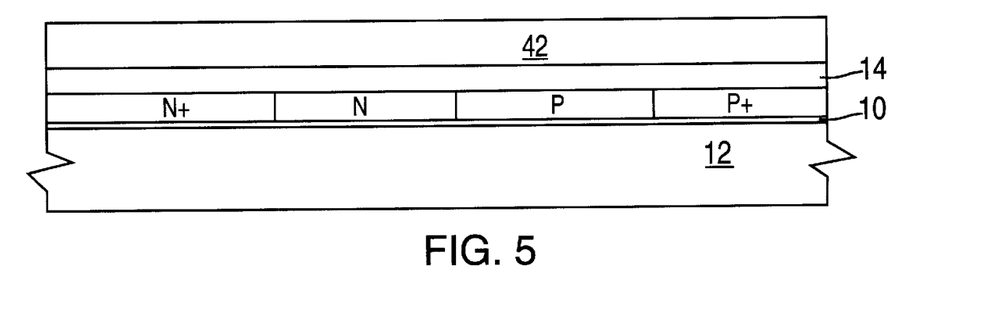
FIG. 5 illustrates a cross-section of a second embodiment of the invention showing a substrate on which a dielectric layer, a polysilicon layer, a tungsten nitride layer, and a lightly doped conductive layer have been formed.

It is depicted in FIG. 5, that following the selective doping of the thin polysilicon layer 14, as discussed in reference to FIG. 2 above, a conductive layer 42 is deposited over the tungsten nitride (WN) layer 16. The conductive layer 42 can be a layer of intrinsic or lightly doped polysilicon or other conductive materials, such as tungsten silicide. The conductive layer generally can be applied by low temperature CVD processing techniques. The work-function of this top conductive layer 42 does not influence the behavior of the subsequently fabricated MOSFET device, since this top layer is not in contact with the gate dielectric 10.

Figure 6:
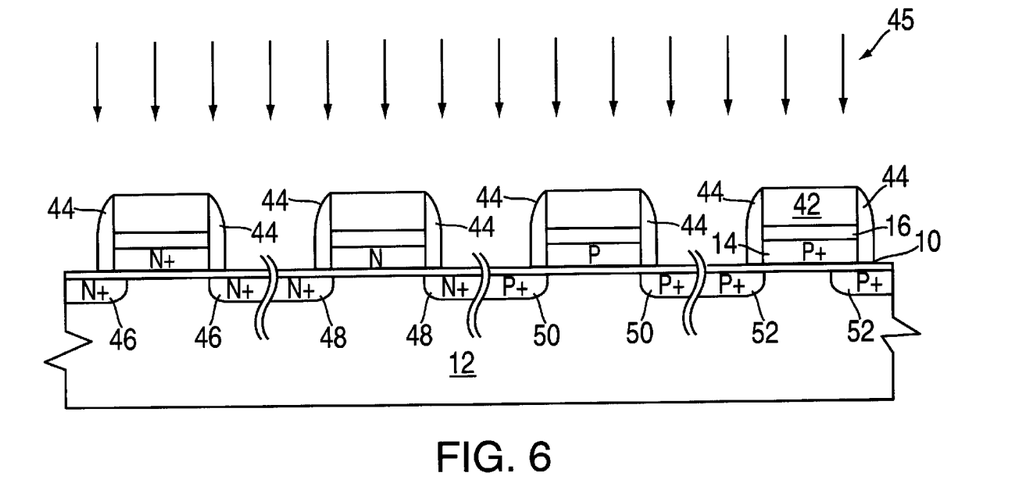
FIG. 6 depicts the structure of FIG. 5 after the gate stack has been patterned, sidewall spacers formed, and masked source drain areas implanted.
Figure 6A:
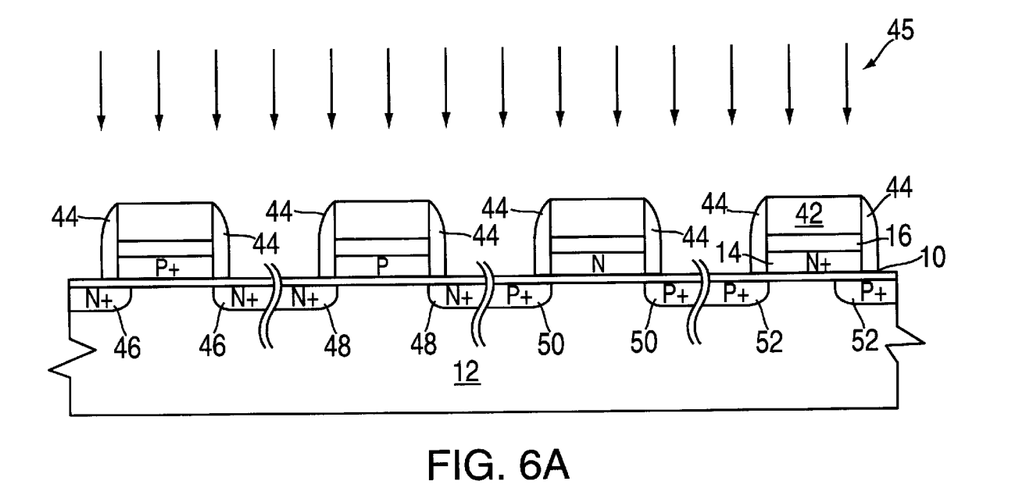
FIG. 6a depicts additional structures of FIG. 5 after the gate stack has been patterned, sidewall spacers formed, and masked source drain areas implanted.

As discussed above in reference to FIG. 4, the gate stack is patterned, sidewall spacers 44 are formed, and masked gate/source/drain implants 45 are performed to make source drain regions 46, 48, 50, and 52, to transform the structure of FIG. 5 into the structures shown in FIGS. 6 and 6a.

Figure 7:
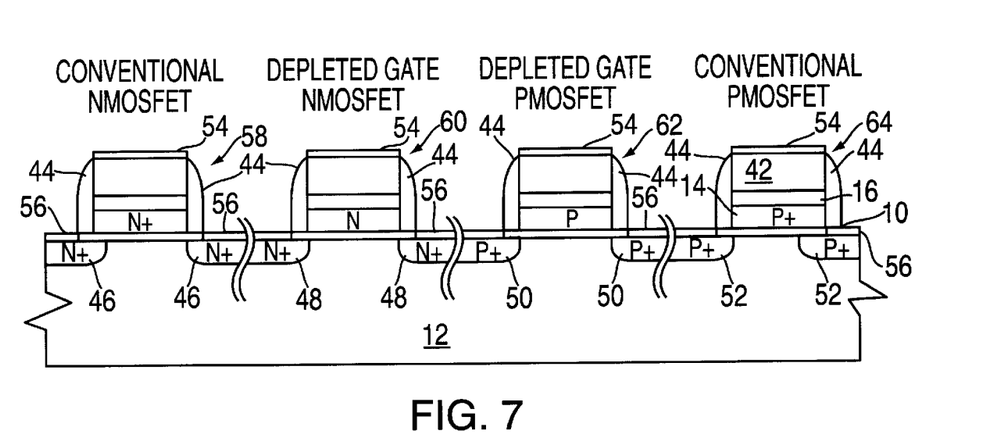
FIG. 7 is a cross-sectional view of completed device structures and top layer of the gate salicided, and following conventional processing.
Figure 7A:
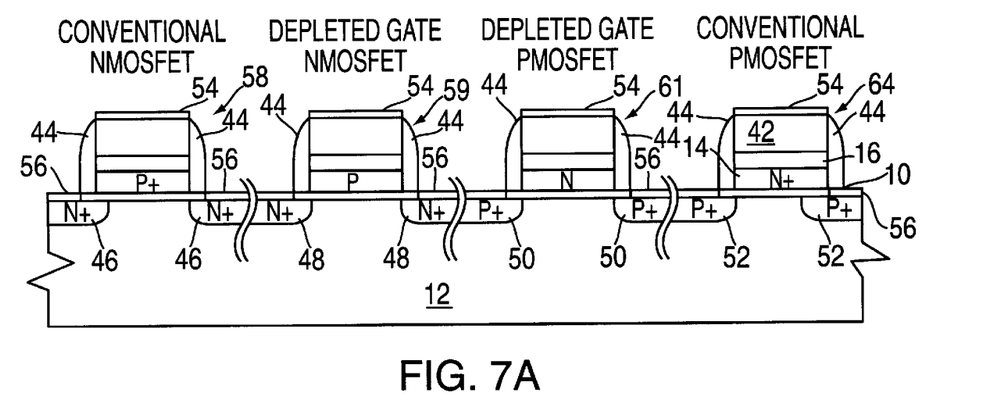
FIG. 7a is a cross-sectional view of additional completed device structures and top layer of the gate salicided, and following conventional processing.

Finally, the diffusion implants and top layer 42 of the gate conductors are salicided to form silicide layers 54 and 56 and result in the conventional (58, 64) and depleted gate MOSFET devices (59, 60, 61, 62) depicted in FIGS. 7 and 7a. During implantation the gate/source/drain regions are simultaneously receiving a common implant. Layer 42 acts to receive the N+ or P+ respective dose. In so doing, if layer 42 was intrinsic or a low doped polysilicon, it is now degenerately doped N+ or P+ polysilicon, in preparation for ohmic contact directly to the gate, or through a salicidation process as depicted by element 54 in FIG. 7. If element 42 was already a $WSi_x$ material (for example), then its stopping power and height would be positioned so as to act as its own mask protecting the doping concentration of element 14, as also did the aforementioned polysilicon layer. The processing then is continued using conventional techniques, as described above in reference to FIG. 4, for formation of additional wiring layers, interlayer dielectrics, and interconnecting vias.

Careful review of the above-described fabrication sequences confirms that the present invention renders six FET devices with differing characteristics. In addition to the two traditional structures comprising N channel transistors with N+ doped polysilicon gates and P channel transistors with P+ doped polysilicon gates, there are four new transistors which can withstand higher voltages between the gate and either the source, drain, or channel.

Figure 8:
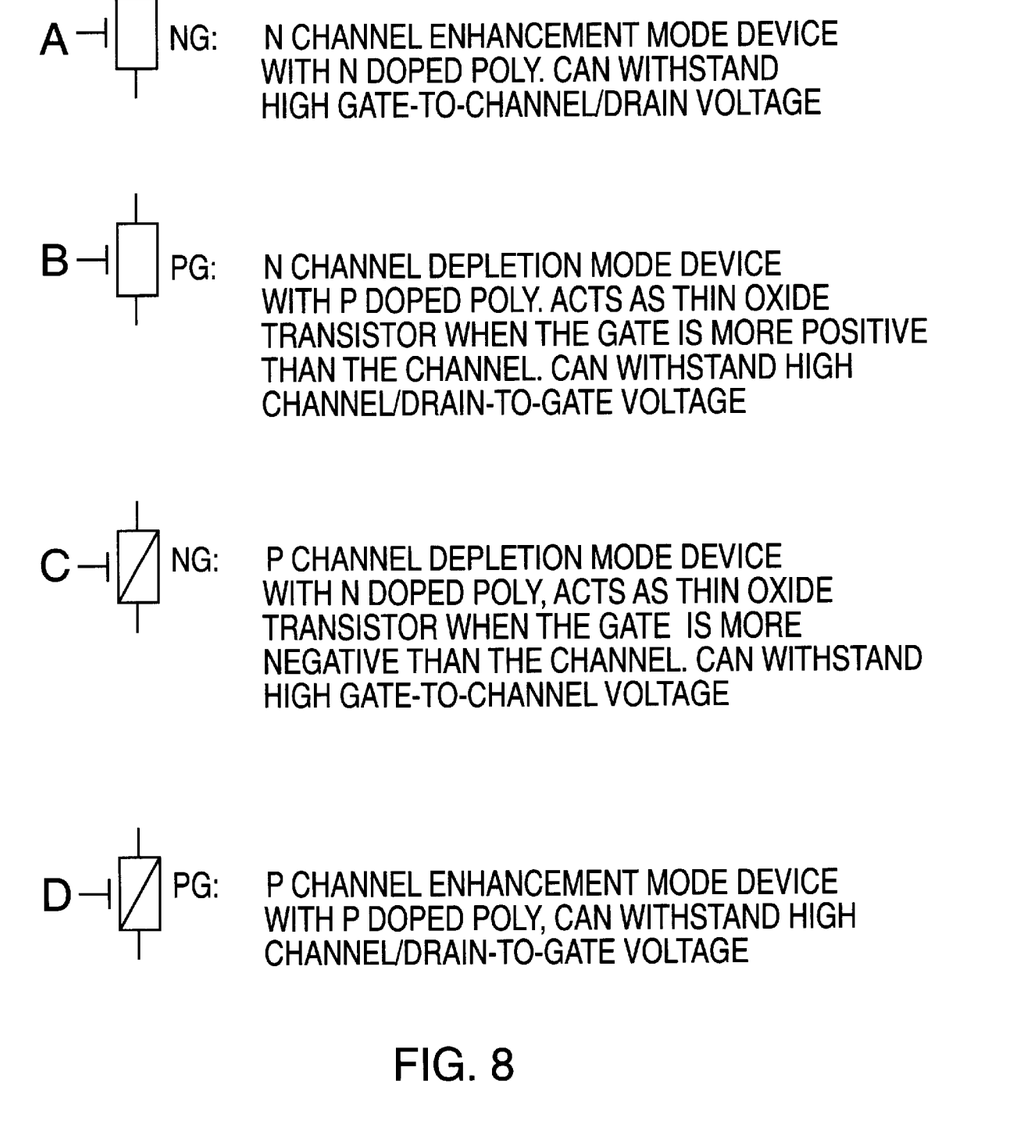
FIG. 8 is a matrix of new transistor structures according to the present invention.

These four non-traditional FET devices capable of withstanding high voltages are depicted in the matrix of FIG. 8. The transistors are labeled with the appropriate designation NG or PG to identify the gate doping and to distinguish them from traditional FET structures in the circuit schematics of FIGS. 10, 11, and 12. As illustrated in FIG. 8 the transistor A is an N channel enhancement mode device with an N-doped polysilicon gate. The device can withstand high gate-to-channel/drain voltage. Transistor B is an N channel depletion mode device with a P-doped polysilicon gate. The device acts as a thin oxide transistor when the gate is more positive than the channel. This transistor can withstand high channel/drain-to-gate voltage. Transistor C is a P channel depletion mode device with an N doped polysilicon gate. The device acts as a thin oxide transistor when the gate is more negative than the channel. This transistor can withstand high gate to channel voltage. Transistor D is a P channel enhancement mode device with a P doped polysilicon gate. This device can withstand high channel/drain-to-gate voltage.

Figure 8A:
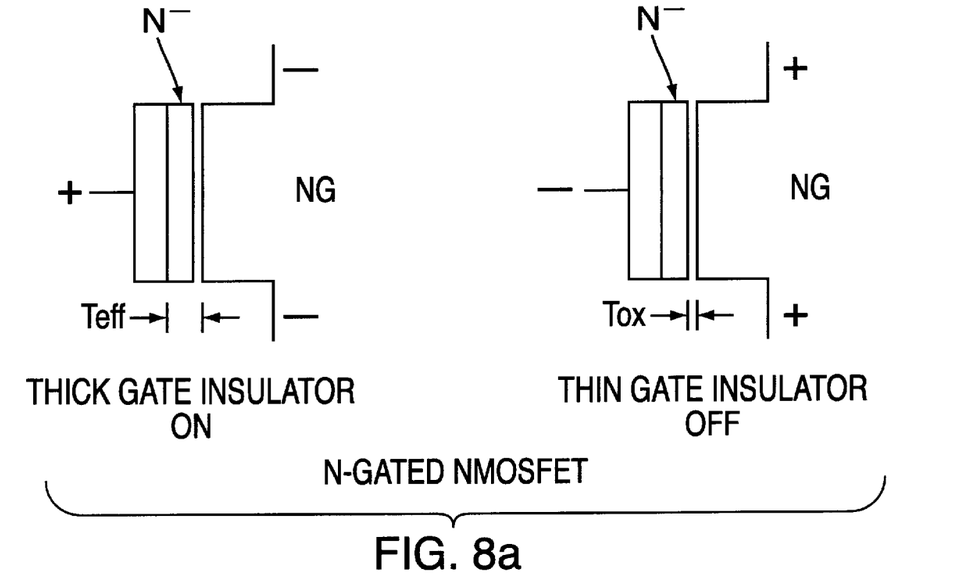
FIGS. 8a, 8b, 8c, and 8d illustrate the unique variation of gate insulator thicknesses between the "ON" and "OFF" condition for the four new device structures of FIG. 8.

The unique variation of gate insulator thickness between the "on" and "off" condition for the four new device types of FIG. 8 is illustrated in FIGS. 8a through 8d. In FIG. 8a, when the NG NMOS gate is biased positive with respect to the source/drain terminals, the gate depletion region is swept free of negative carriers turning this region intrinsic which then acts as an insulator adding to the deposited gate oxide insulator to produce a thicker effective gate insulator Teff as shown. Therefore, the maximum voltage that can be withstood in the "ON" condition will be higher than the standard device. In the "OFF" condition, carriers remain in the depletion region in a conductive state resulting in a gate insulator thickness that defaults to the deposited gate oxide thickness Tox. Maximum gate to source/drain voltage that can be withstood in the "OFF" condition will be substantially the same as the standard device.

Figure 8B:
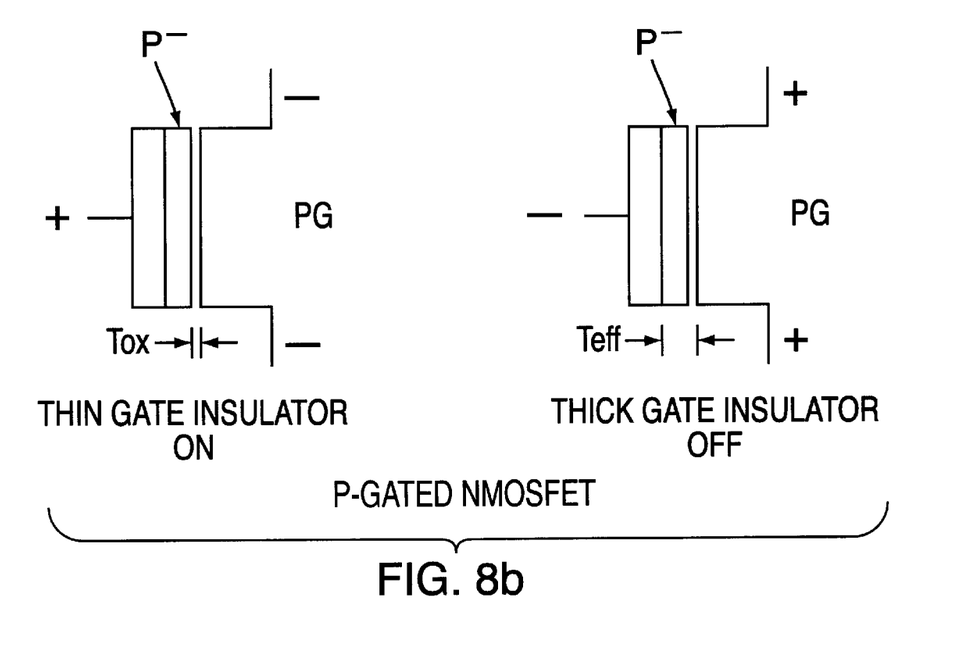

A PG NMOS with P type gate depletion region is shown in both the "ON" and "OFF" condition in FIG. 8b. Positive carriers in the P type depletion region move in the reverse direction to the N region carriers in 8a above. An "ON" PG NMOS has a conductive gate corresponding to a thinner gate insulator Tox while in the "OFF" condition it has a thicker gate insulator Teff.

Figure 8C:
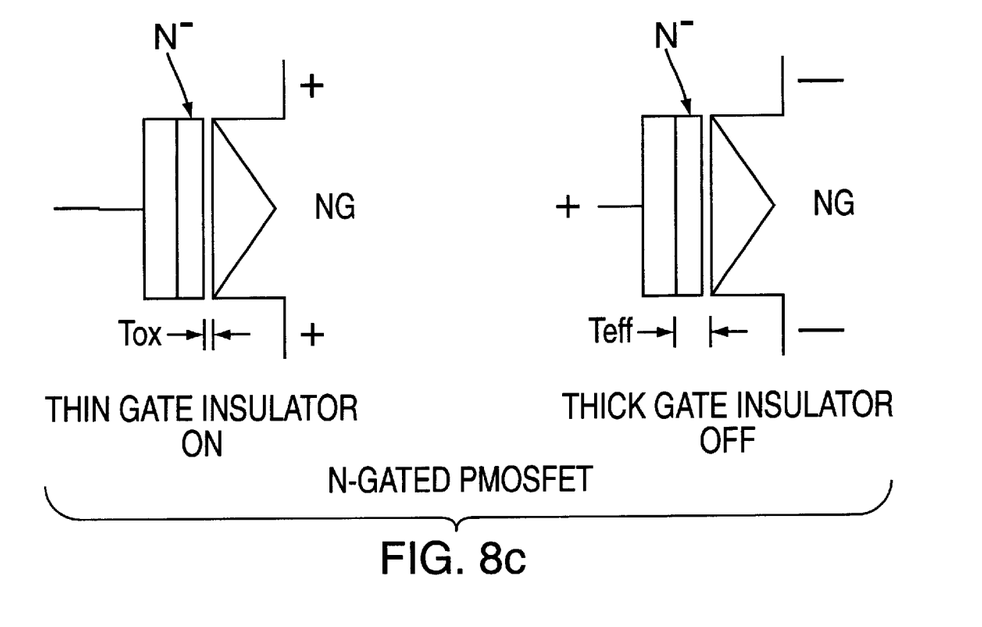
Figure 8D:
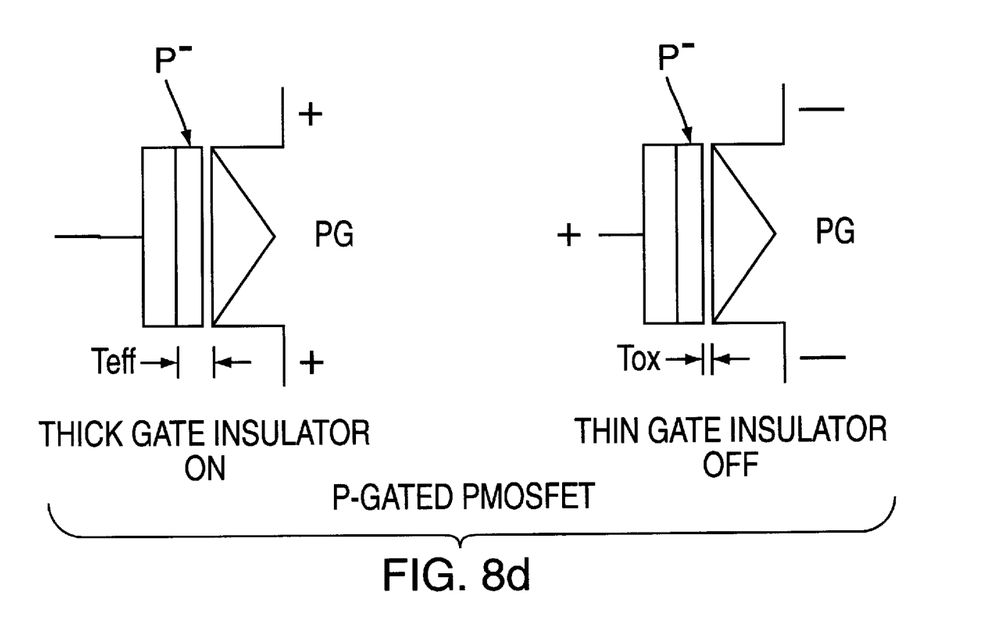

The two new PMOS devices shown in FIGS. 8c and 8d exhibit the same characteristics as the new NMOS devices as described in regard to FIGS. 8a and 8b, above.

Figure 11A:
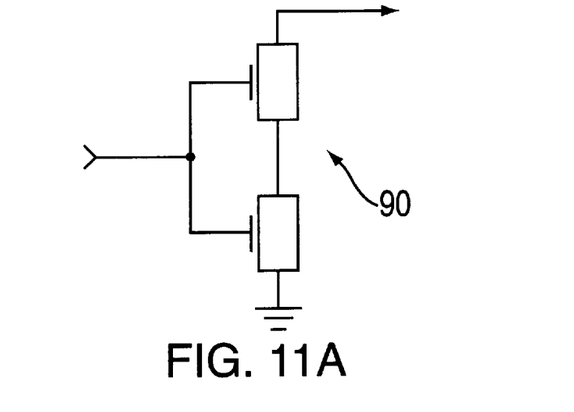
FIG. 11 is a comparison of the output transistors of two prior art driving techniques and an output transistor arrangement of a driving technique according to the present invention.
Figure 11B:
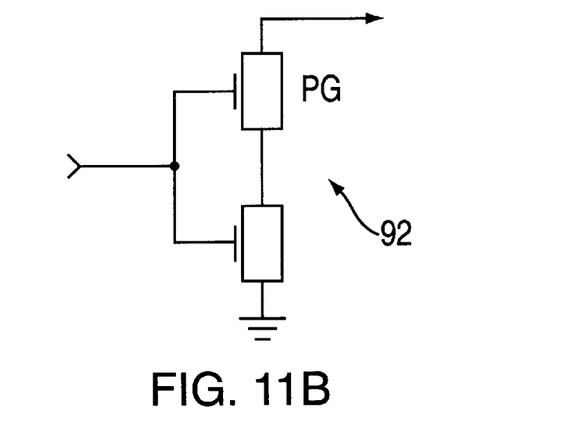
Figure 11C:
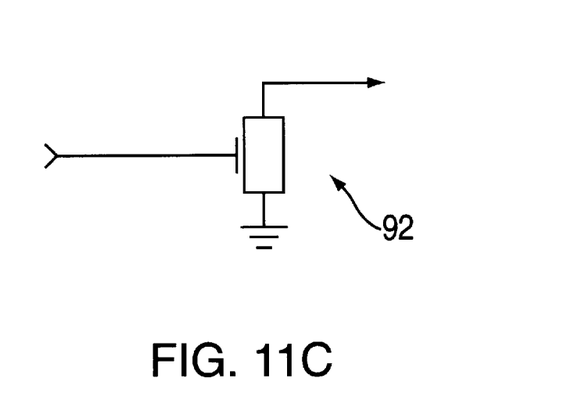

The non-traditional transistor devices as depicted in FIG. 11 can be combined in circuit arrangements to provide useful high voltage functions, some featuring improved performance.

All four of the new, non-traditional transistor structures can be used to provide higher voltage capacitors, when appropriate biases are applied between gate and channel. Possible applications for these transistors include voltage doublers, change pumps, and high voltage bypass capacitors.

Figure 9:
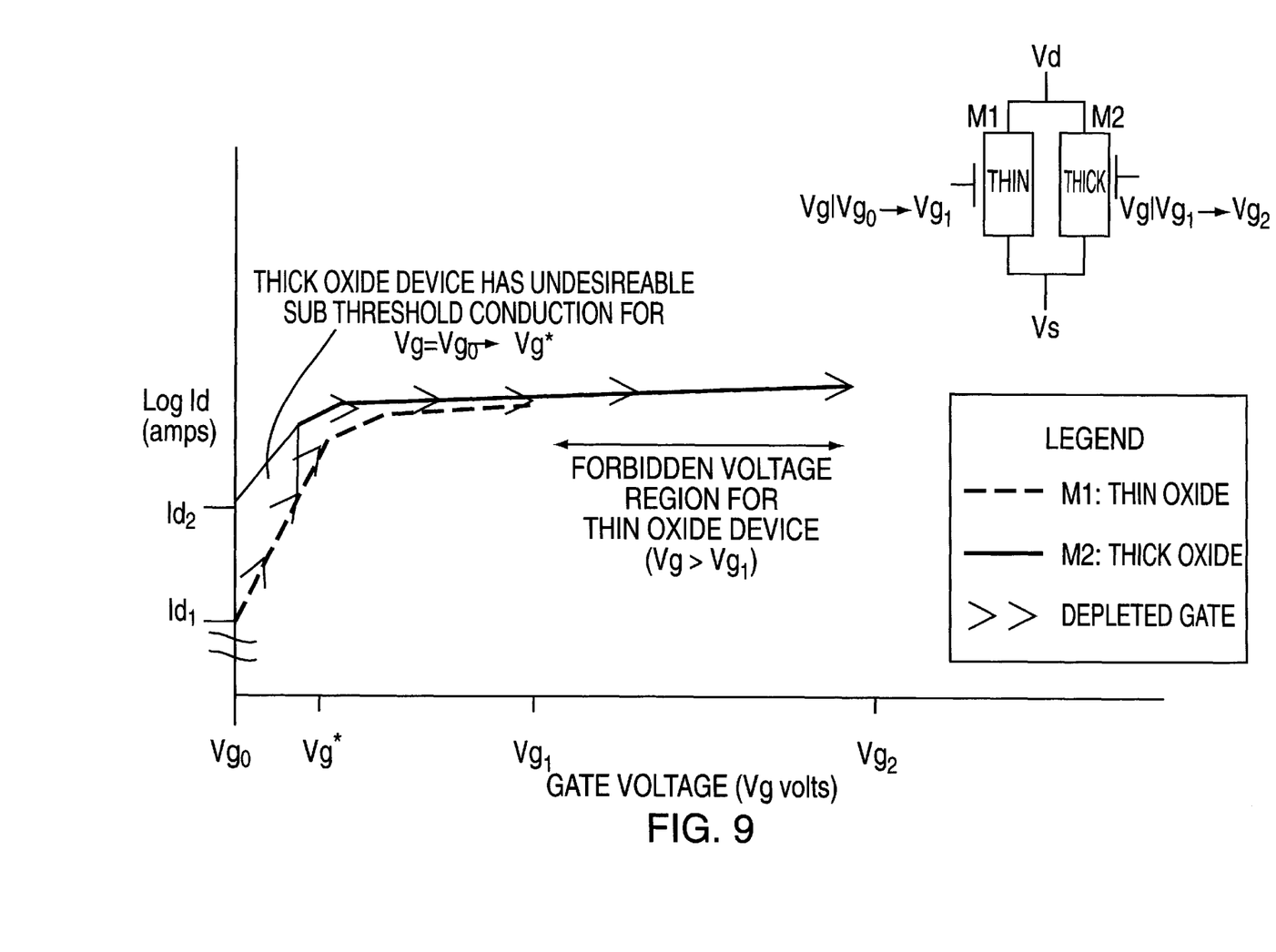
FIG. 9 illustrates the output characteristics of HV and LV devices, and one of the hybrid device types fabricated according to the present invention, a LV/HV combination device.

FIG. 9 illustrates the output characteristics of HV and LV devices, and one of the hybrid device types fabricated according to the present invention, a LV/HV combination device.

As shown in FIG. 9, an LV device has the exemplary characteristic of a steep sub-threshold slope, and thus a very low off current. Unfortunately, the device cannot be used at high voltages, as a use in the forbidden zone would result in an unreliable device subject to gate oxide failure.

Also as shown in FIG. 9, a HV device has the exemplary characteristic of operation in the LV forbidden zone. Unfortunately, this device has a shallow sub-threshold slope, lending itself not suitable for low voltage operation.

A low power/high voltage device is necessary for low power I/O operation, or mixed signal operation, and is not achievable in the industry today do to the conflicts described above in reference to the LV and HV devices. These types of devices consume considerable chip area, and in order to have a very low power chip these devices must have the combined properties of the LVIHV device, as accomplished by the present invention.

The present controlled hybrid LV/HV device properties meets the objective described above, as illustrated in FIG. 9, by the pair M1 and M2. The hybrid single device behaves like this switched pair. Between a pre-determined "off voltage range" illustrated as Vg0>Vg* in the figure, the gate electrode of the hybrid is accumulated and the device behaves and operates as an LV. During the voltage range between Vg* and Vg1 the hybrid device switches between the off state of the LV device and the on state of the HV device, as the gate electrode itself changes from an accumulation mode to a depleted mode (or from Thin Oxide to Thick Oxide as seen by the channel to the gate contact). After this transition is complete, the Hybrid device now electrically operates as the HV device and is allowed to reliably enter the forbidden region of LV operation.

Figure 10:
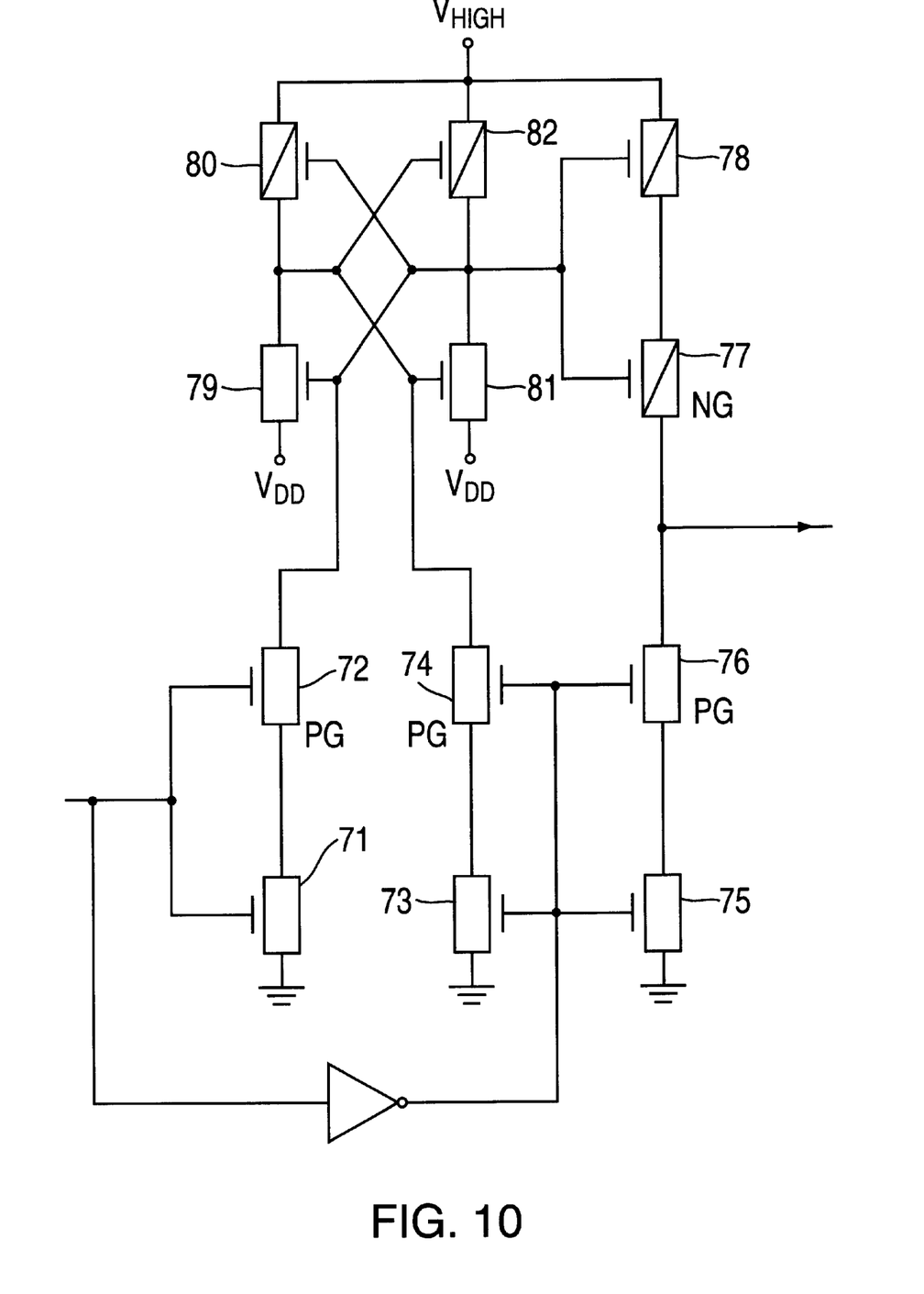
FIG. 10 is a low signal voltage to high signal voltage conversion circuit according to the present invention.

FIG. 10 shows a new low signal voltage to high signal voltage conversion circuit. Such circuits are useful for I/O when communicating between two chips requiring different power supplies. This communications problem typically occurs when the chips are fabricated with different vintage technologies. Typically the lower voltage chip is fabricated with transistors which can not withstand the voltage needed on the higher voltage chip. The transistor structures described, coupled with the circuits described below, help address that problem.

Similar problems arise when interfacing to special on-chip features requiring high voltage operation. Examples include special fuses and antifuses which are programmed with overvoltage. DRAMs, "Flash" RAMs and other NVRAMs also require overvoltages.

According to the present invention, a novel circuit is accomplished comprising a series connection of a traditional device with a device having a novel transistor structure according to the present invention. The traditional N channel transistor is series connected at the drain with a new N channel device having a (more lightly doped) P polysilicon gate region. The new device behaves like a depletion mode transistor. When turned off (with zero volts on its gate) the source rises to one threshold above ground. Thus it protects the traditional series transistor from the full high voltage supply. Also when turned off the effective gate insulator near the drain is widened by depletion of the P doped polysilicon to better withstand the high voltage supply. The two series transistors are always turned OFF and turned ON together. When turned ON the two transistors share the voltage drop between the output and ground. Once the output voltages falls below Vdd, both transistors behave as thin oxide transistors along their entire channel length. The topmost transistor, being a depletion mode transistor, is heavily turned ON. The result is improved performance as will be discussed below.

In the circuit of FIG. 10, there will also be found traditional P channel transistors which are series connected with new P channel transistors having (more lightly doped) N polysilicon gates. These function in an analogous fashion to the N channel transistors described in the paragraph above.

Voltage translation to properly drive transistors 77, and 78 is provided by transistors 71, 72, 73, 74, 79, 80, 81, and 82.

Cross coupled transistors 79, 80, 81, and 82 reestablish the signal swing offset to Vhigh. Transistors 79 and 81 clamp the down level slightly below Vdd. To drive these cross coupled pairs, the series connection again is invoked between traditional devices and new devices (See transistors 71, 72, 73, and 74). This series connection is needed because the drains of transistors 72 and 74 can rise to Vhigh.

Referring now to FIG. 11, depicted are only the output transistors of three driving techniques. These three are: two stacked traditional enhancement mode devices 90, the invention 92, and a single transistor 94 with a substantially thicker gate oxide sufficient to withstand Vhigh.

This invention is faster than two stacked traditional transistors because when ON, the invention deploys a depletion mode transistor on top of the stack. It will be recalled that the upper device most influences performance because its source can not be brought to ground during the transient. Additionally, the two stacked traditional enhancement mode devices 90 cannot withstand the voltage across the top transistor.

Referring to the thicker oxide device, this approach requires only a single transistor. All else being equal, one might expect its performance to be faster. However, its oxide is up to twice as thick; so its threshold is higher and its transconductance is lower. If its oxide is twice as thick, its channel length approaches being twice the length of either of the two channels in the invention. During the final half the drive transient, when both transistors are in the linear regime, one could expect performance similar to two traditional enhancement mode transistors in series.

Figure 12:
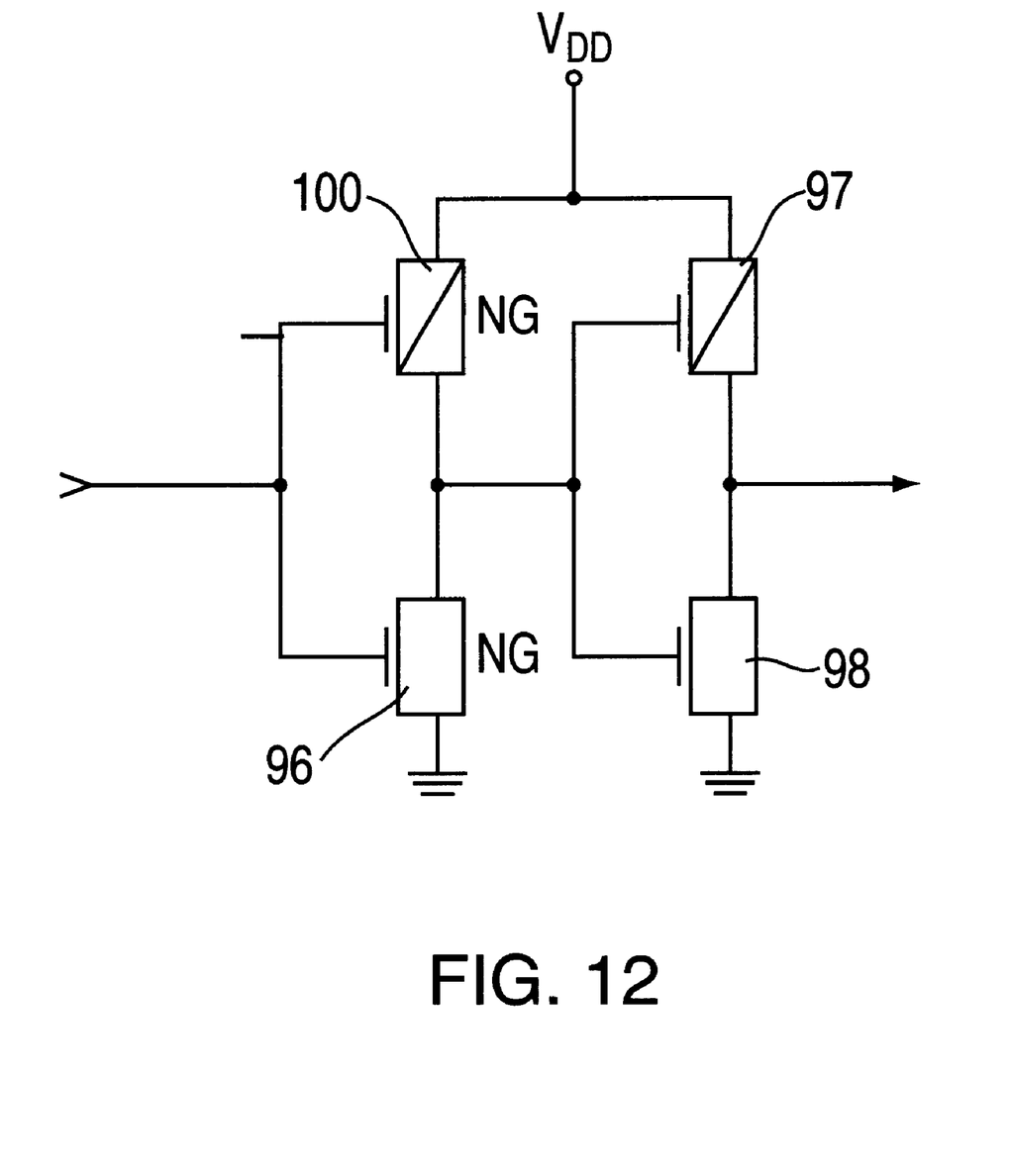
FIG. 12 depicts a high voltage signal level to low voltage signal level circuit according to the present invention.

Turning now to the final figure, FIG. 12, depicted is a high voltage signal level to low voltage signal level circuit. Here two of the new structures 96 and 100 are deployed. The bottom transistor has been selected for its ability to withstand a higher gate to channel voltage. The top transistor has been selected to withstand higher voltage when off and provide an appropriate threshold given the large input signal and the small on-chip supply voltage (Vdd). Subsequent transistors (97, 98) can be traditional structures.

While the invention has been described with reference to specific embodiments thereof, it is intended that all matter contained in the above description or shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention defined in the appended claims.

We claim:

1. A method of forming transistor devices, comprising the steps of:
    a) providing a substrate;
    b) forming a dielectric layer on the substrate;
    c) forming a first gate layer on the dielectric layer;
    d) forming a conductive diffusion barrier on the first gate layer;
    e) doping the first gate layer with a preselected, non-uniform, lateral concentration distribution of a dopant species;
    f) forming a highly conductive second gate layer on the diffusion barrier;
    g) forming a protective cap layer on the second gate layer;
    h) forming openings through the layers formed by steps c) through g) down to the dielectric layer;
    i) forming sidewalls on remaining ones of the layers formed by steps c) through g); and
    j) implanting a selected dopant in the substrate through the openings to form source/drain diffusion regions.

2. The method of claim 1 wherein step e) includes selecting an N-type dopant species for the first gate layer and step j) includes selecting an N-type dopant for the substrate having substantially the same concentration as the N-type dopant species for the first gate layer.

3. The method of claim 1 wherein step e) includes selecting an N-type dopant species for the first gate layer and step j) includes selecting an N-type dopant for the substrate having substantially higher concentration than the N-type dopant species for the first gate layer.

4. The method of claim 1 wherein step e) includes selecting a P-type dopant species for the first gate layer and step j) includes selecting a P-type dopant for the substrate having substantially the same concentration as the P-type dopant species for the first gate layer.

5. The method of claim 1 wherein step e) includes selecting a P-type dopant species for the first gate layer and step j) includes selecting a P-type dopant for the substrate having substantially higher concentration than the P-type dopant species for the first gate layer.

6. The method of claim 1 wherein step e) includes the steps of masking the first gate layer and doping each of selected regions in the first gate layer with one of opposite type dopants.

7. The method of claim 1 wherein step e) includes the steps of masking the first gate layer and doping each of selected regions in the first gate layer at one of varying dopant concentrations.

8. The method of claim 1 wherein step j) includes the steps of implanting a selected first type dopant through a first opening and implanting a selected second type dopant through a second opening.

9. The method of claim 1 including the step of selecting a conductive diffusion barrier material from the group consisting of tungsten nitride, titanium nitride, and tantalum silicon nitride.

10. A method of forming transistor devices, comprising the steps of:
    a) providing a substrate;
    b) forming a dielectric layer on the substrate;
    c) forming a first gate layer on the dielectric layer;
    d) forming a conductive diffusion barrier on the first gate layer;
    e) doping the gate layer with a preselected, non-uniform, lateral concentration distribution of a dopant species;
    f) forming a highly conductive second gate layer on the diffusion barrier;
    g) forming openings through the layers formed by steps c) through f);
    h) forming sidewalls in the openings;
    i) implanting a selected dopant in the substrate through the openings to form source/drain diffusion regions;
    j) removing the dielectric layer in the openings including exposing the substrate the bottom of the openings; and
    k) saliciding both the substrate at the bottom of the openings and remaining regions of the conductive second gate layer.

11. The method of claim 10 including the step of selecting a salicide for step k) from the group consisting of cobalt, titanium, tungsten, and nickel.

12. The method of claim 1 comprising forming the first gate layer to a controlled thickness.

* * * * *